United States Patent
Hao et al.

(10) Patent No.: US 8,266,506 B2
(45) Date of Patent: Sep. 11, 2012

(54) METHOD AND APPARATUS FOR MULTISET MEMBERSHIP TESTING USING COMBINATORIAL BLOOM FILTERS

(75) Inventors: Fang Hao, Morganville, NJ (US);
Muralidharan Sampath Kodialam, Marlboro, NJ (US); Tirunell V. Lakshman, Eatontown, NJ (US); Haoyu Song, Edison, NJ (US)

(73) Assignee: Alcatel Lucent, Paris (FR)

( * ) Notice: Subject to any disclaimer, the term of this patent is extended or adjusted under 35 U.S.C. 154(b) by 782 days.

(21) Appl. No.: 12/426,227

(22) Filed: Apr. 18, 2009

(65) Prior Publication Data
US 2010/0269024 A1    Oct. 21, 2010

(51) Int. Cl.
*G06F 11/00* (2006.01)
(52) U.S. Cl. .................................. 714/777; 714/778
(58) Field of Classification Search .............. 714/777, 714/778, 774, 798, 799
See application file for complete search history.

(56) References Cited

U.S. PATENT DOCUMENTS

| | | | |
|---|---|---|---|
| 7,168,025 B1 * | 1/2007 | Berkovich | 714/759 |
| 7,519,819 B2 * | 4/2009 | Bradley et al. | 713/176 |
| 7,849,134 B2 * | 12/2010 | McCanne et al. | 709/203 |
| 8,005,277 B2 * | 8/2011 | Tulyakov et al. | 382/125 |
| 2003/0223584 A1 * | 12/2003 | Bradley et al. | 380/229 |
| 2010/0082562 A1 * | 4/2010 | Deolalikar et al. | 707/695 |

OTHER PUBLICATIONS

E M Rains, N J A Sloane, "Table of constant weight binary codes," http://www.research.att.com/~njas/codes/Andw/, downloaded Apr. 28, 2009.
M Ramakrishna, E Fu, E Bahcekapili, "A performance study of hashing functions for hardware applications," in Proc. 6th Int'l Conf. on Computing and Information, 1994, pp. 1621-1636.

* cited by examiner

*Primary Examiner* — Dieu-Minh Le
(74) *Attorney, Agent, or Firm* — Wall & Tong, LLP

(57) ABSTRACT

A method and apparatus providing improved set membership determination and group membership identification of candidate data elements using a single Bloom filter programmed to provide a plurality of non-zero f-bit binary vectors, where each of the f-bit binary vectors is associated with a respective group. The Bloom filter is programmed using one or more (but not all) of a plurality of hash filter sets.

21 Claims, 6 Drawing Sheets

US 8,266,506 B2

METHOD AND APPARATUS FOR MULTISET MEMBERSHIP TESTING USING COMBINATORIAL BLOOM FILTERS

FIELD OF THE INVENTION

The invention relates to the field of communication networks and, more specifically, to identifying group membership using hash functions and Bloom filters.

BACKGROUND

Network packet processing, such as forwarding and measurement of packets, often involves the use of table lookups. High speed network applications require fast and deterministic lookup performance. For example, at 10 Gbps line speed where up to 30 million packets can arrive at a line port per second, table lookups for a packet need to be finished in just 32 ns. While Content Addressable Memory (CAM) techniques satisfy this requirement, such a brute force approach to the lookup function is associated with high power consumption and low density.

Bloom filters play an important role in supporting many applications. They are very efficient in terms of memory consumption, such that fast hardware implementation is possible with embedded memory. However, a Bloom filter alone can only support membership queries; that is, answer the question of whether an element is in a table or not. A Bloom filter is incapable of giving any extra information about the queried element. For many applications, such associated information needs to be retrieved for the member elements.

SUMMARY

Various deficiencies in the prior art are addressed via systems, methods and apparatus providing improved set membership determination and group membership identification of candidate data elements. In one embodiment, a single Bloom filter is programmed to provide a plurality of non-zero f-bit binary vectors, where each of the f-bit binary vectors is associated with a respective group. The Bloom filter is programmed using one or more (but not all) of a plurality of hash filter sets such that a weighting of the hash filter sets is provided. In various embodiments, each of the f-bit binary vectors associated with properly characterized group memberships have the same number of "ones" or set bits, such that an error is indicated where a group membership probe into the Bloom filter using a candidate data element results in an f-bit vector having a different number of "ones" or set bits.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Various embodiments provide a novel Bloom filter based architecture that supports multi-set membership testing. Unlike previous solutions, the various embodiments described herein do not require a priori knowledge of group size information. The performance of the embodiments is optionally improved by using constant weight error correcting codes for coding the group id. Using error correcting codes particularly improves performance when there are large number of sets. The resulting embodiments are amenable to a variety of time-critical network applications.

In one embodiment, a single Bloom filter is programmed with a plurality of non-zero f-bit binary vectors, where each of the f-bit binary vectors is associated with a respective group. The Bloom filter is programmed using one or more (but not all) of a plurality of hash filter sets such that a weighting of the hash filter sets is provided. Moreover, the f-bit binary vectors associated with properly characterized group memberships have the same number of "ones" bits such that a mischaracterization error is identified where a group membership probes into the Bloom filter using a candidate data element results in a vector having a different number of "ones" bits.

The techniques of the various embodiments may be implemented in memory in a highly efficient manner. Specifically, commodity memory devices and/or internal memory devices associated with a processing element may be used to implement the various embodiments, thereby lowering system cost and power consumption. In one embodiment, on-chip static random access memory (SRAM) is used to implement sets of hash filters and a single Bloom filter. Optionally, logic elements process the output of the Bloom filter to correct errors and determine group membership of processed candidate data elements. The various embodiments described herein operate to reduce misclassification failures of group IDs, though classification failures may occur.

Figure 1:
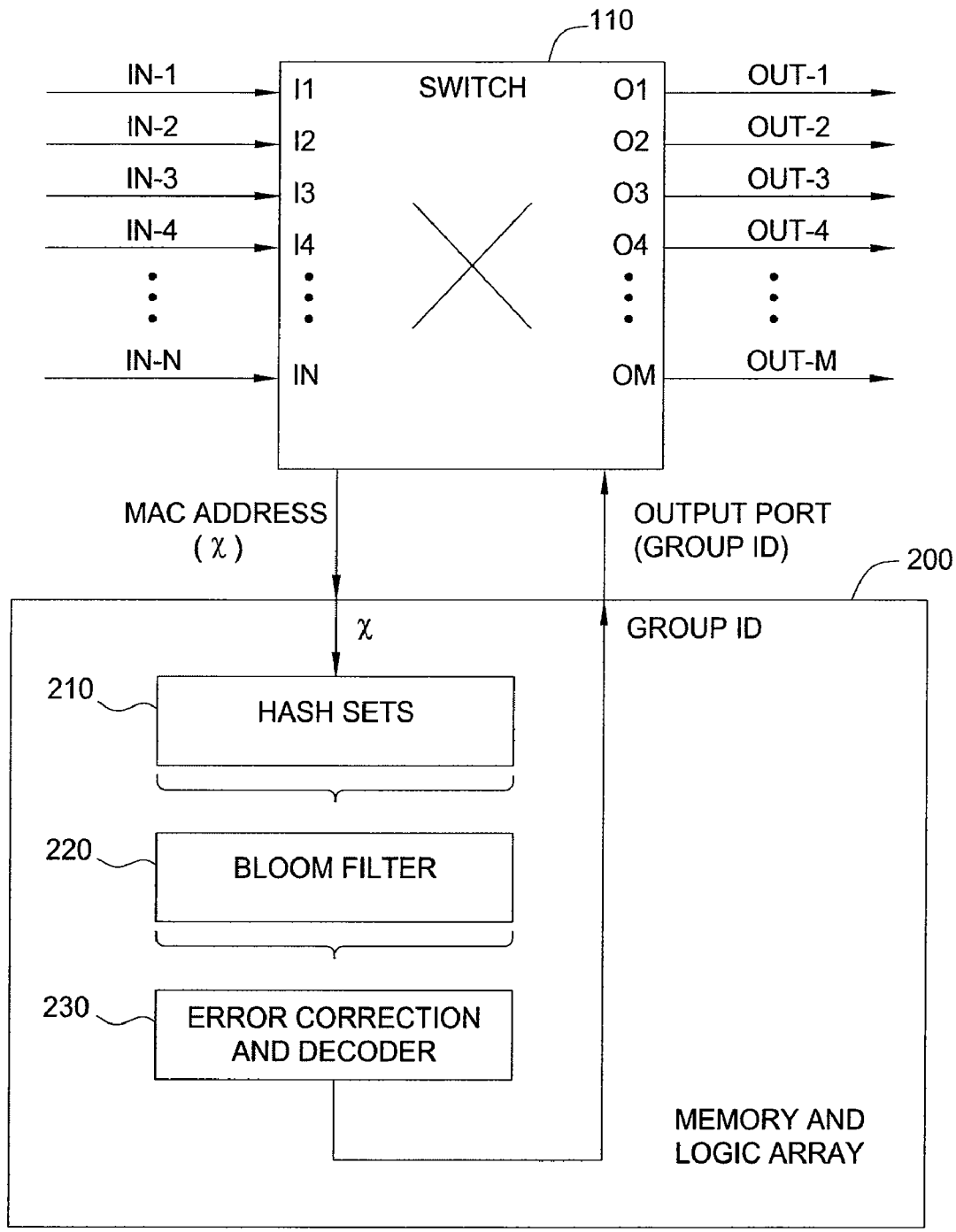
FIG. 1 depicts a high level block diagram of a system benefiting from an embodiment of the present invention.

FIG. 1 depicts a high level block diagram of a system benefiting from an embodiment of the present invention. Specifically, FIG. 1 depicts a system including a switch 110 operatively coupled to a memory and logic array 200.

The switch 110 receives a plurality of input packet streams denoted as IN-1, IN-2 and so on up to IN-N (collectively input packet streams IN) at corresponding input ports I1, I2 and so on up to IN. The switch 110 couples packets, data frames and/or input streams from any of the input ports to any of a plurality of output ports O1, O2 and so on up to OM. The output ports provide corresponding output packets, data frames and/or output streams denoted as OUT-1, OUT-2 and so on up to OUT-M.

In one embodiment, the switch 110 comprises a layer-2 switch in which media access control (MAC) address information is extracted from input packet streams and used to identify the appropriate output port to which the input packet stream should be coupled. In other embodiments, the switch 110 comprises a router or other network elements adapted for switching packet streams from input to output port according to Internet Protocol (IP), Ethernet or other packet/dataframe/stream addressing information.

In the Layer-2 switch example, the MAC address includes destination information such that all packets associated with the destination should be switched to the output port associated with that destination. Stated differently, those packets or data frames associated with a particular destination address share a common group id. By identifying the group ID associated with packets or data frames, the appropriate output port is defined such that the switch 110 may route the packets or data frames to the appropriate output port.

In the Layer-2 switch example, the memory and logic array 200 is configured to operate as a search engine in which a MAC table is queried with a packet or data frame destination address. If the destination address is not in the MAC table, then the switch 110 floods the packet, data frame and/or stream to each of the output ports. If the destination address is in the MAC table, then the switch 110 forward to the packet, data frame and/or stream to the appropriate output port.

The memory and logic array 200 is configured to provide a plurality of hash sets 210 which are used to initially program a Bloom filter 220 to store a plurality of non-zero f-bit binary vectors representative of group IDs corresponding to output ports of the switch 110. Each candidate data element x (such as destination address) is hashed into the Bloom filter as part of a group membership probe. The binary vector representing the group ID of the candidate data element acts is extracted from the Bloom filter 220 and processed by the error correction and decoder logic 230 to provide a group ID (such as an output port identification) associated with the candidate data element X.

Several embodiments of the memory and logic array 200 will be discussed below with respect to the various figures and text within this specification. Generally speaking, the embodiments of the memory and logic array 200 are implemented in hardware to provide the high processing speeds typically necessary for the applications discussed herein. However, it will be appreciated by those skilled in the art that advances in processing speed enable software implementations as well as combination hardware and software implementations of the various embodiments discussed herein.

The system depicted above with respect to FIG. 1 may be adapted to various other applications, such as multi-action packet classification, pattern matching, packet routing, deep packet inspection, statistical counting and the like. For example, multi-action packet classification requires the lookup to return the action associated with the matching classifier, while pattern matching requires the lookup to return the rule id of the matching pattern. The various embodiments are applicable to these and other high throughput (typically) packet processing operations.

Figure 2:
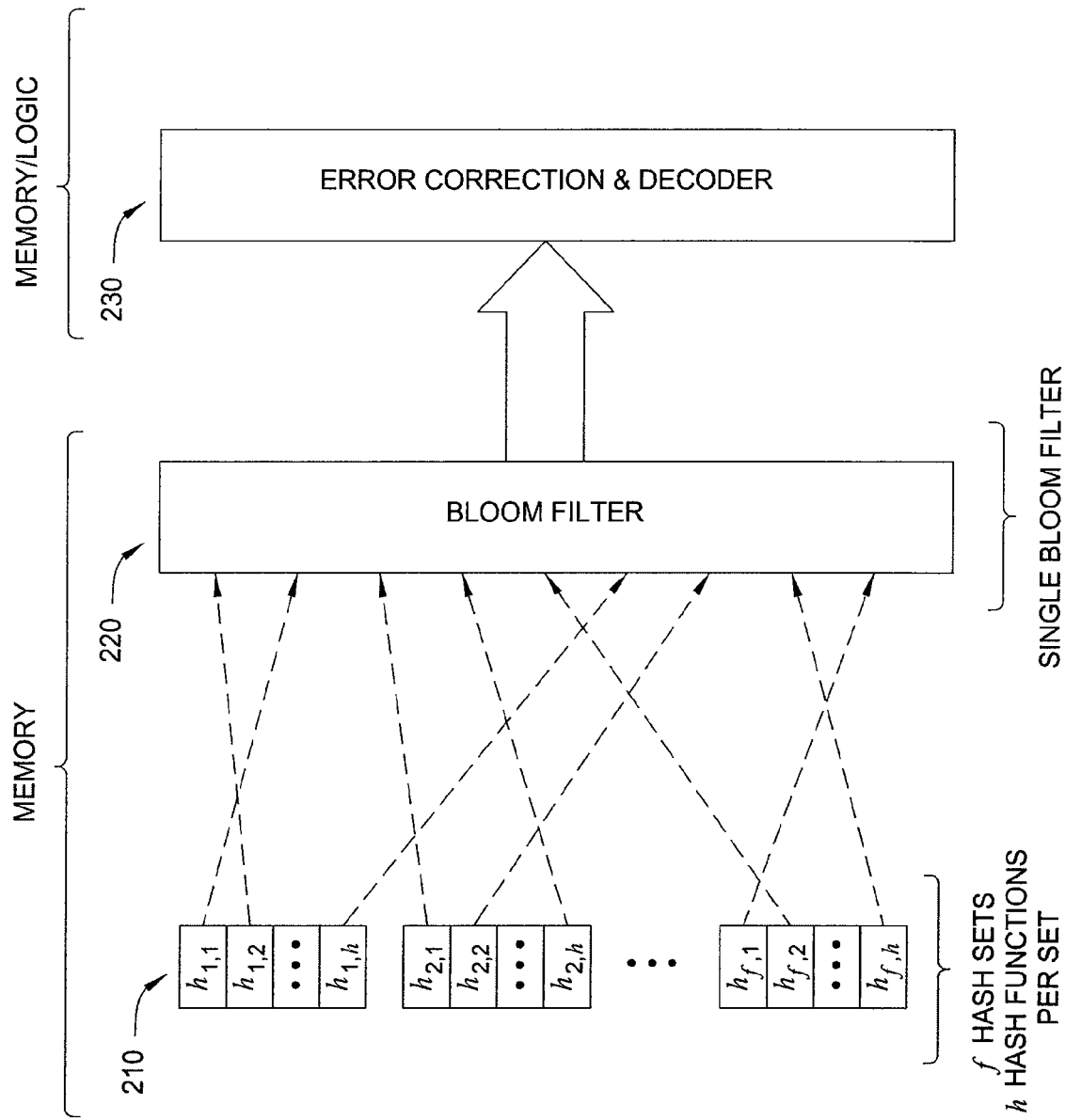
FIG. 2 depicts a functional representation of an embodiment suitable for use in various applications including the system of FIG. 1.

FIG. 2 depicts a functional representation of an embodiment suitable for use in various applications including the system of FIG. 1. Specifically, the embodiment 200 of FIG. 2 comprises a plurality of hash sets (illustratively f hash sets), where each hash set includes h hash functions. The plurality of hash sets is operative to program/initialize a Bloom filter 220 to include therein f-bit binary vectors indicative of group IDs for candidate data elements. An error correction and decoder processor or logical element 230 operates to decode resultant binary vectors from the Bloom filter 220 to determine therefrom group IDs associated with the candidate data element. Optionally, the error correction and decoder processor or logical element 230 corrects errors within the resultant binary vectors to avoid returning a misclassification or non-classification error (i.e., a failure to find the destination address group).

As will be discussed in more detail below, in one embodiment each of the f-bit binary vectors indicative of a valid group ID comprises a specific number of "ones" or set bits. For example, a valid group ID binary vector may comprise three set bits within a five bit vector. If more or fewer bits are set within the five bit vector, then the vector is invalid (i.e., not indicative of a valid group ID). As will be discussed in more detail below, error codes may also be associated with the f-bit binary vectors so that in the case of a binary vector deemed to be invalid, the error codes may be used to correct the invalid binary vector to drive therefrom a valid binary vector (i.e., a correct group ID).

Problem Description

The problem to be solved can be formally modeled as follows: Let S denote a set comprising of n elements. Each element of the set belongs to one of γ groups. Let G denote the set of groups. Given some $x \in S$ use $g(x) \in G$ to represent the group that contains x. Denote g(x) as the group identification (group id) of x. The elements of the set are not specified a priori, but are given one at a time. The objective is to maintain the elements along with the associated groups in a dynamic data structure that permits fast classification of x: Given any x a determination is made as to g(x). If $x \notin S$ then return $g(x) = \bot$. Therefore the valid range for the output is $G \cup \{\bot\}$. Given a group $k \in G$ use $n_k$ to denote the number of elements $x \in S$ such that $g(x) = k$. The values of $n_j$ are not known a priori.

The inventors have developed a fast and efficient data structure to insert and query for the values of the given elements. This probabilistic data structure is denoted as a COMbinatorial Bloom filter (COMB). The COMB permits fast insertion and querying of the group ids for the elements in S. Since the data structure is probabilistic, there are several types of errors that can occur. Generally speaking, the data structure may be viewed as maintaining the elements of multiple sets where each set corresponds to the set of elements that map to a given group id.

COMB Error Types

The types of errors that can occur with a COMB can be classified into three categories:

(1) False Positive: Assume a querying for the group id for some $x \notin S$. Instead of returning $\bot$, the data structure returns some $k \in G$. This is similar to a false positive probability in a Bloom filter. It is assumed that the false positive probability of the COMB is upper bounded by α.

(2) Misclassification: In this case the data structure outputs the wrong group id for some $x \in S$. In other words, given some $x \in S$ whose group id is $g(x) = k \in G$. The COMB instead outputs $g(x) = j \neq k$. A particular case of misclassification is when given some $x \in S$, it is declared that $g(x) = \bot$. This is a false negative. There are several applications where false negatives and misclassification are not desirable or acceptable. For simplicity it is assumed herein that misclassification is not permitted, though various embodiments address this problem.

(3) Classification Failure: If misclassification is not permitted, one approach is to declare that the group id for some $x \in S$ is not known. Unlike misclassification, where a wrong answer is given, classification failure is a declaration that there is an inability to provide as a result the correct value of g(x). The COMB may be adapted to provide for a probability of classification failure of less than β. In some cases the classification failure can be resolved through an off-chip hash table (the classification failure is translated into multiple hash table lookups). In one embodiment, an off-chip hash table is implemented in hardware as part of, illustratively, the controller 650 of the implementation 600 described below with respect to FIG. 6.

COMB Performance Metrics

Since one goal is to implement a COMB in hardware, COMB performance metrics are tailored to measure the performance of a hardware implementation of the COMB. There are two main metrics that can be used to compare different COMB with respect to memory and processing overhead:

(1) Capacity of a COMB: There are two different capacities associated with a COMB, given a fixed amount of memory used to implement the COMB. First is the number of elements (cardinality of the set S) that can be accommodated in the COMB while satisfying all the error bounds will be referred to as the capacity of the COMB. The term κ is used to denote the capacity of a COMB. Second is the number of group ids that can be accommodated in the COMB. This is referred to as the group capacity of the COMB. The term ρ is used to denote the group capacity of a COMB.

(2) Number of memory accesses for insertion: This refers to the number of times it is necessary to hash into memory for each element inserted into the COMB. A simple way of measuring the number of memory accesses is to measure the total number of accesses for each arrival. For example, in the case of a standard Bloom filter with h hash functions, the number of memory accesses for each arrival is h. This number can be misleading if many of these accesses can be done in parallel. If the memory is split into smaller chunks then it may be possible to access these chunks in parallel. If there are c chunks of memory and $a_i$ denotes the number of accesses to be made to chunk i, then $\max_{1 \leq i \leq c} a_i$ denotes the number of memory accesses to be performed. As an example, in the case of a standard Bloom filter with h hashes assume that the total amount of memory is split into h parts. When there is an arrival there is one hash into each of the h memory partitions. These accesses can be done in parallel. Therefore, in the case of a standard Bloom filter the number of memory accesses for insertion is one.

(3) Number of memory accesses for classification: As in the case of insertion, the number of memory accesses for testing for the group id is also measured. In a regular Bloom filter with h hashes, where all the hashes access the same chunk of memory, the number of memory accesses for testing is h. However, if the implementation splits the memory into h chunks, then these h memory accesses can be done in parallel. In this case testing can be done with a single memory access.

It is noted that different mechanism perform well on one or more of these metrics while possibly performing poorly on others. Therefore it is appropriate to pick a mechanism that is matched to the application. For example, in the case of traceback applications where testing is done relatively infrequently, it is much more important to keep the number of memory accesses low for insertion. For packet classification or deep packet inspection, where insertions are relatively infrequent but testing is done frequently, the number of memory accesses for testing has to be kept low.

Non-Partitioned Combinatorial Bloom Filter (COMB)

In a COMB, each group id is mapped to a non-zero f bit binary vector which is the group's code. The term C(g) is used as the code for group g∈G. The code for ⊥ is the f bit zero vector. Corresponding to each bit in the code is a set of h hash functions. Each set of h hash functions is referred to as hash set. Since there are f hash sets, each with h hash functions, a COMB requires fh hash functions. Generally speaking, f is the number of hash sets (or groups), h is number of hash functions in a group, and θ is number of hash sets that are chosen (θ<f) to do hashing during a programming stage. When we testing a data element (probing the Bloom filter), a valid f-bit output vector should return exactly θ hash sets (sets fully set to one when hashed) with positive result.

Figure 3:
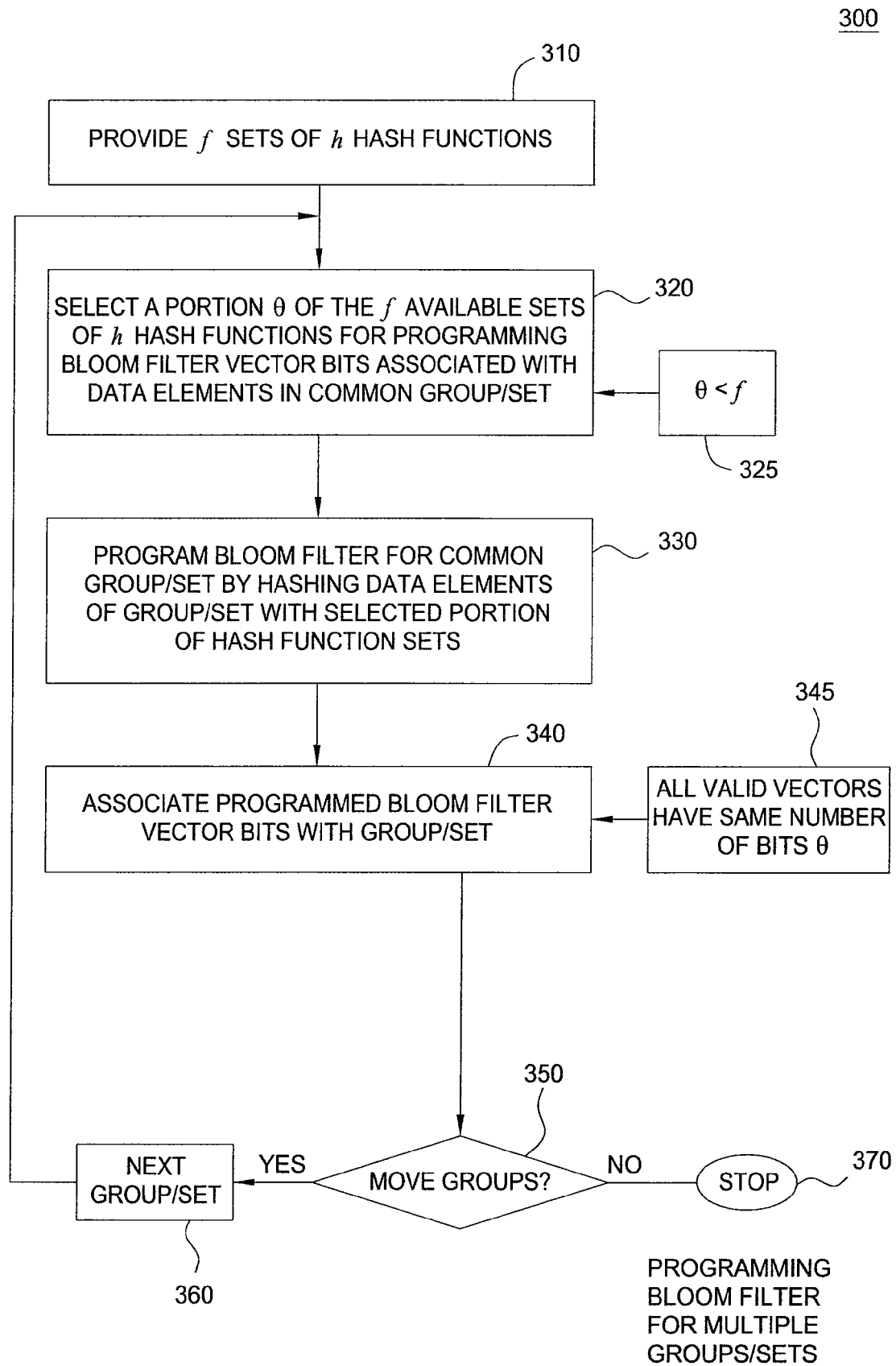
FIG. 3 depicts a flow diagram of a method of programming a Bloom filter according to one embodiment.
Figure 4:
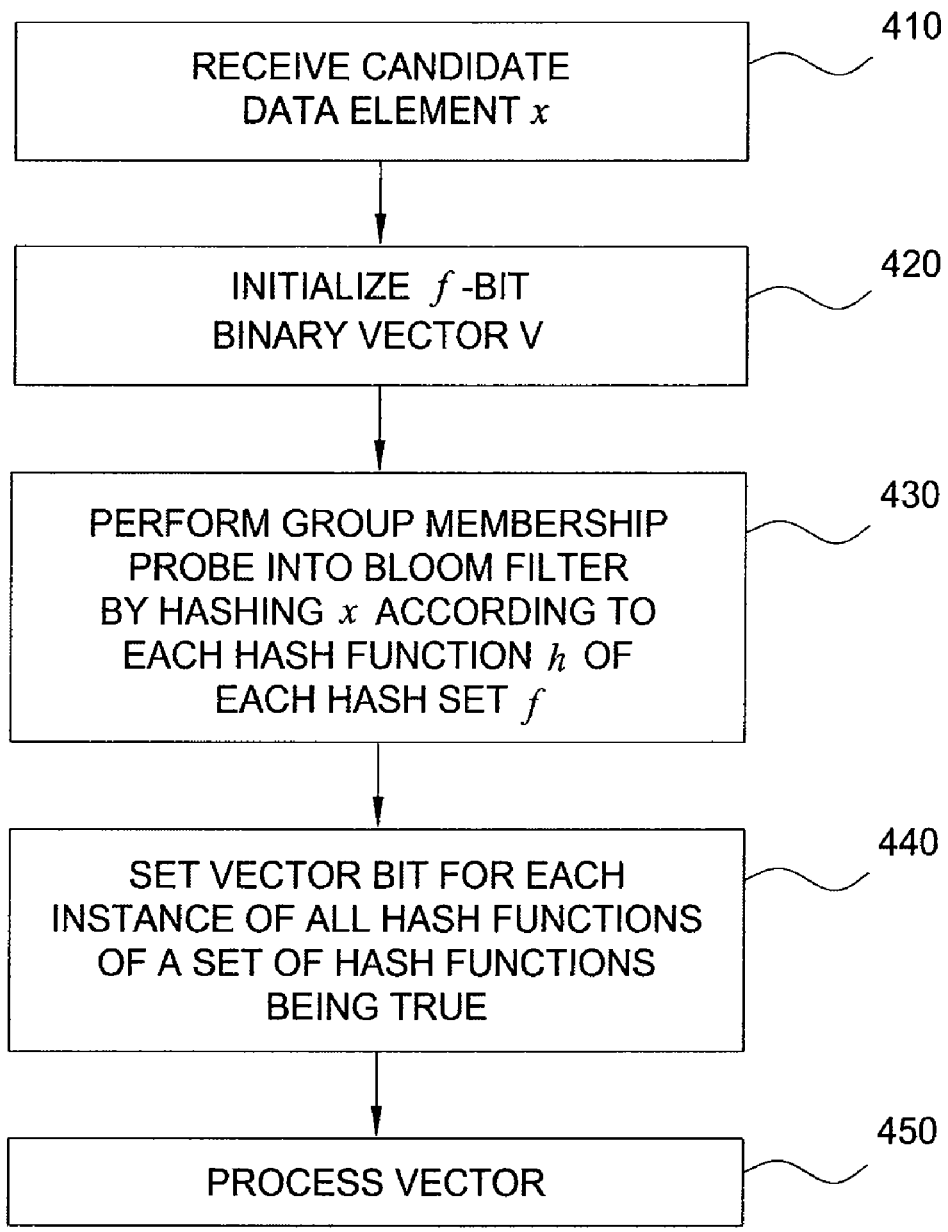
FIG. 4 depicts a flow diagram of a method of processing a candidate data element according to one embodiment.
Figure 5:
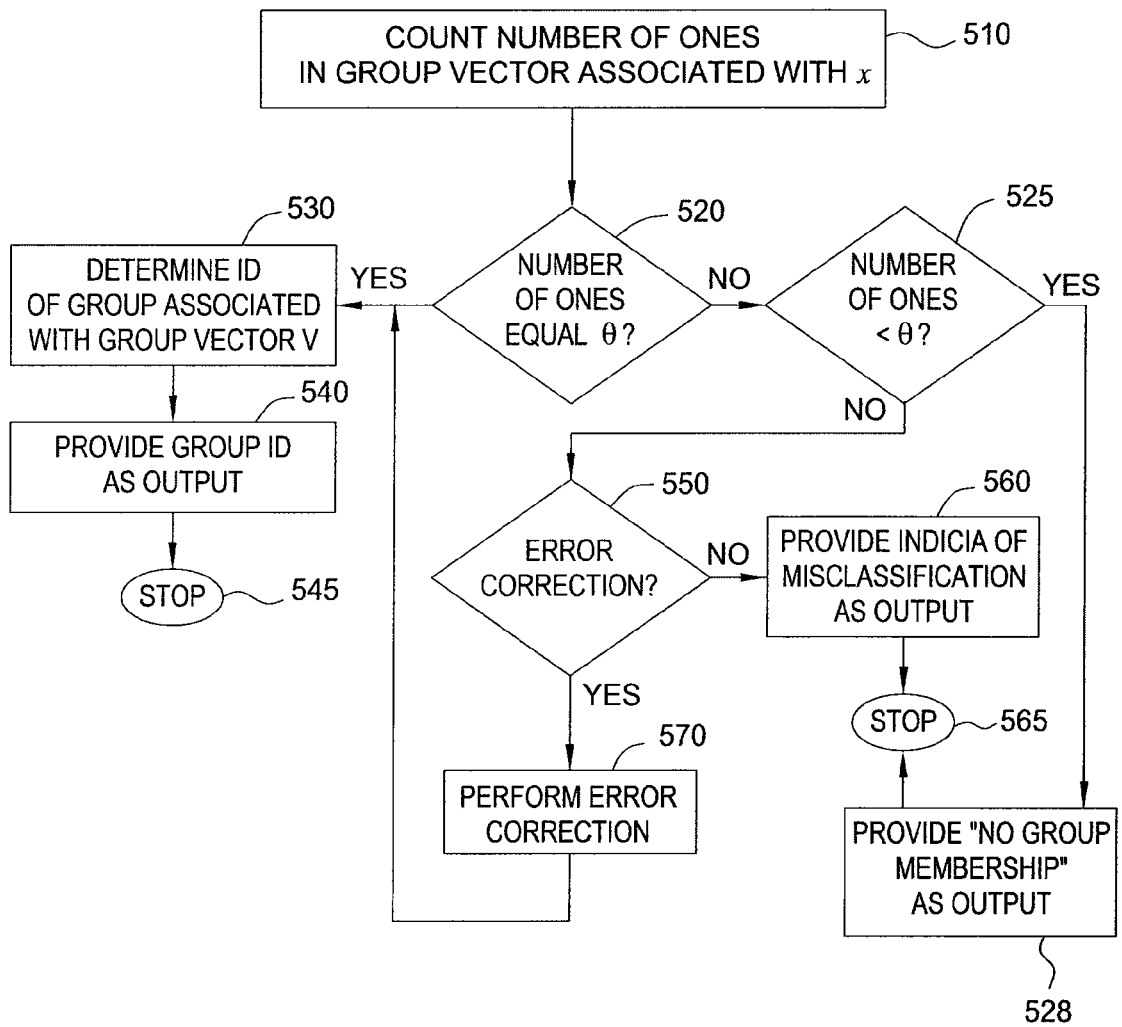
FIG. 5 depicts a flow diagram of a method of processing a Bloom filter output vector according to one embodiment.

The insertion and checking operations will now be described with respect to FIGS. 3-5. Specifically, FIG. 3 depicts a flow diagram of a method of programming a Bloom filter according to one embodiment; FIG. 4 depicts a flow diagram of a method for processing a candidate data element according to one embodiment; and FIG. 5 depicts a flow diagram of a method of processing a Bloom filter output vector according to one embodiment.

Bloom Filter Programming

For an insertion or Bloom filter programming operation, assume that it is desired to insert x∈S with group id g(x) into the COMB. The first step is to compute C(g(x)). The term x is hashed using each of the hash sets where C(g(x)) is one, also setting the corresponding bits in the COMB. Since each of the hash sets has h hash functions, the embodiment will hash x a total of $hw_{C(g(x))}$ times into the Bloom filter, where $w_v$ is defined as the weight of a binary vector v (i.e., the number of ones in the binary vector).

As an example, assume that it is necessary to insert a data element x whose group id is 7 into the COMB. Assume the number of hash sets f=5. The code for each group is a 5 bit binary vector. Let C(7)=(0,1,1,0,1) denote the code for group 7. Let the number of hash functions in each hash set be h=10. To insert x, it is hashed using hash sets 2, 3, and 5 (i.e., the second, third and fifth bit of the 5 bit binary vector). Since each hash set has 10 hash functions, the operation is to hash 30 times into the COMB and set all these bits to one. Note that there are a total of 30 memory accesses for inserting x into the COMB.

FIG. 3 depicts a flow diagram of a method of programming one or more groups/sets of data elements into a Bloom filter Bloom filter according to one embodiment. The method 300 of FIG. 3 is entered at step 310, where f sets of h hash functions are provided.

At step 320, a portion of the f available sets of h hash functions are selected for programming Bloom filter vector bits associated with data elements in a common group or set. That is, a subset (i.e., less than f sets) of the f available sets of hash functions is selected to be used to insert the member data elements of the set of data elements to be recognized by subsequent Bloom filter probes. Referring to box 325, the number of hash functions h is selected to be equal to a parameter denoted as θ. The parameter θ will be discussed in more detail below. Briefly, the parameter θ defines the number of hash function groups used to program a Bloom filter with the members of a set of data elements, which in turn defines the number of ones in a resulting binary vector indicative of a match or membership in the set of a data element being tested (probing the Bloom filter).

At step 330, the Bloom filter is programmed for data elements within a common group or set of data elements by hashing each data element of the group/set using the hash functions of the selected subset of the f available sets. That is, if two out of four sets of hash functions are selected, each data element of a group or set of data elements is hashed using the hash functions of each of the selected (illustratively two) hash function sets to program the Bloom filter. After each of the data elements of a set of data elements has been hashed, the resulting set of ones within the Bloom filter comprises a data set representative vector.

At step 340, the vector bits set during programming step 330 are associated with a set of data elements. That is, after hashing each element of the set of data elements, all of the ones or set bits in the Bloom filter resulting from hashing each data element of the set of data elements (i.e., the data set representative vector) is associated with the set or group of data elements.

Referring to box 345, in one embodiment all valid vectors are constrained to comprise the same number of set bits, the number of set bits being denoted by the parameter θ.

At step 350 at query is made as to whether more groups or sets of data elements are to be processed. If so, then at step 360 the next group or set of data elements is selected and steps 320-340 are repeated to generate thereby a Bloom filter f-bit vector representative of the next group or set of data elements. Otherwise, the method 300 exits at step 370.

In general, the Bloom filter programming method uses a coding scheme based on number of data elements in a set, number of groups with distinct IDs, memory size and so on. Selecting a coding scheme is discussed in more detail below. Generally speaking, a coding scheme is selected based upon specific attributes of the task to be performed, the physical memory allocable to the task, the number of data elements in one or more groups, the number of groups and so on. Each data element is inserted into the Bloom filter by applying hashing according to group ID encoding. When all of the data elements (i.e., members or keys) are inserted into the Bloom filter, the resulting bit vector is associated with the corresponding group ID.

Bloom Filter Probing

For a checking or group membership probe operation, in order to determine the group id of a given data element x, it is hashed using all f hash sets (f×h hashes in all). A f bit binary vector v is initialized to zero. Bit i in vector v is set to one if all h hash functions in hash set i results in a one. The group id of x is then $C^{-1}(v)$. There are fh memory accesses for checking. In this example, to determine the group id for some given x, it is hashed into the COMB using all 5 hash sets (50 hashes in all).

As an example, let v=(0,0,1,1,0) denote the vector of hash results (i.e., the third and forth bits of the 5 bit vector are set). In this case the memory location of all 10 hashes from hash set 3 and hash set 4 were set to one. The group id whose code is v is now determined and, optionally, output as the code for the group ID of x. Checking for group id therefore has 50 memory accesses.

FIG. 4 depicts a flow diagram of a method for processing a candidate data element according to one embodiment. The method 400 of FIG. 4 is entered at step 410 when a candidate data element x is received. At step 420, an f-bit binary vector v is initialized (e.g., set to zeros). At step 430, a group membership probe into the Bloom filter is performed by hashing the candidate data element x according to each hash function h of each hash set f. At step 440, a vector bit is set for each instance of all hash functions within a set of hash functions being true. That is, a vector bit is set each time all of the hash functions h within a hashed set f are true with respect to the candidate data element x. At step 450, the resulting f-bit vector is processed to determine that least the group ID associated with the candidate data element x. In one embodiment, the f-bit vector is processed according to the steps described below with respect to FIG. 5.

The insertion and checking operations outlined above have two characteristics, which may be observed by computing the compute the number of hashes that are made into the COMB when inserting all x∈S. This is needed in order to size the COMB for achieving the desired accuracy. Let τ represent the total number of hashes into the COMB.

$$\tau = h \sum_{x \in S} w_{C(g(x))} \qquad \text{(eq. 1)}$$
$$= h \sum_{k \in G} n_k w_k$$

where $n_k$ is the number of elements that have group id k and $w_k$ is the weight of the code for group id k. Since $n_k$ are not known a priori, the upper bound of the expression is defined with the maximum weight code and that can lead to a significant decrease in the capacity of the COMB. The second characteristic is the fact that there can be misclassification of the group id if there are false positives for one or more of the hash sets.

Non-Partitioned COMB with Fixed Weight Group Code

The inventors have determined that both characteristics are resolved by the use of a fixed weight code for all groups such that the code or valid vector used for each of the groups has the same number of ones (i.e., $w_{C(k)}\theta$ for all $k \in G$). In this case the number of hashes into the COMB is provided by equation 2 as follows:

$$t = h \sum_{k \in G} n_k w_k \qquad \text{(eq. 2)}$$
$$= h\theta \sum_{k \in G} n_k = h\theta n.$$

Fixed weight codes also reduce the problem of misclassification. There will be a false positive if some $x \notin S$ ends up with exactly θ bit level false positives. However note that if x∈S, then there will certainly be θ ones when checked for membership. If there are additional ones due to false positives, then an immediate declaration is made of an inability to determine the group id for x. By designing the COMB appropriately, the accuracy requirements are met.

The inventors denote a COMB with f hash sets and a group id code with weight θ as an (f,θ)-COMB. Note that the number of memory accesses for insertion is hθ. The checking procedure for a fixed weight group code is as follows:

For a checking operation, in order to determine the group id of a given x, it is hashed using all f hash sets (fh hashes in all). An f bit binary vector v is initialized to zero. Bit i in vector v is set to one if all h hash functions in hash set i results in a one. If w(v)<θ then it is declared that g(x)=⊥. If w(v)>θ, then a classification failure is declared. If w(y)=θ, then the group id of x is then $C^{-1}(v)$. There are fh memory accesses for checking.

FIG. 5 depicts a flow diagram of a method of processing a Bloom filter output vector according to one embodiment. The method 500 of FIG. 5 is also suitable for use in the vector processing step 450 of the method 400 of FIG. 4.

At step 510, the number of ones in the group vector associated with a candidate data element x is counted. That is, the number of bits set in the f-bit vector is determined. At step 520, a determination is made as to whether the number of set bits (i.e., ones) is equal to the parameter θ.

If at step 520 the number of set bits in the bit vector equals θ, then the bit vector is valid and the method proceeds to step 530, were the identification of the group or set of data associated with the specific group vector is determined. For example, as noted elsewhere in this description, the group identification may comprise a search term, and output port of a switch or router, or any number of logical or physical groupings depending upon the application.

At step 540, the code for the group ID is provided as an output, such as to a processing device controlling a switching element/router, a search result to a query engine and so on. At step 545, the method is exited.

If at step 520 the number of set bits in the bit vector is not equal to θ, then at step 525 query is made as to whether the number of set bits is less than θ. If the number of set bits is less than θ, then at step 528 a "no group membership" output is provided and the method exits at step 565.

If at step 525 the number of set bits is not less than θ, then an error has occurred which may be correctable, and the method proceeds to step 550. At step 558 determination is made as to whether an error correction should be performed. If so, then at step 570 error correction is performed in the method proceeds to step 530. Error correction may comprise any of the known techniques for correcting errors such as Hamming Code, forward error correction (FEC), checksum processing, parity bit processing and so on.

If at step 550 error correction is not to be performed, then at step 560 in addition of a misclassification is provided as an output and the method exits at step 565. That is, when the number of set bits in the bit vector is greater than θ and no error correction can be performed, a misclassification error is likely present.

Computing Error Probabilities

False positive as well as the classification failure probabilities are increasing functions of the probability that a false positive is returned with any given hash set. Before computing the false positive and classification failure probabilities, a determination is made of the optimal number of hashes h that minimizes the probability of getting a false positive with any hash set. Let p denote the probability that a particular hash set returns a one in error. Let m denote the number of bits of memory that are available for the Bloom filter. The false positive probability p for any given hash set is given by $$p = \left(1 - \left(1 - \frac{1}{m}\right)^{\theta nh}\right)^h \quad \text{(eq. 3)}$$
$$\approx \left(1 - e^{-\frac{\theta nh}{m}}\right)^h$$

To find the value of h that minimizes p the above expression is differentiated with respect to h and set to zero to get $$h = \frac{m}{n\theta} \log 2 \quad \text{(eq. 4)}$$

and the minimum value of p is $$p = (0.6185)^{m/n\theta} \quad \text{(eq 5)}$$

This analysis is similar to the false positive analysis of a standard Bloom filter with nθ elements. For the following discussions it is assumed that each hash set has h=m/nθ log 2 hash functions.

Probability of False Positive

There is a false positive if exactly θ hash sets have a false positive. Each hash set has a false positive probability of p. Therefore, the probability that exactly θ out of f hash sets result in a one is given by $$\text{False Positive Probability} = \binom{f}{\theta} p^\theta (1-p)^{f-\theta} \quad \text{(eq. 6)}$$
$$\leq \binom{f}{\theta} p^\theta$$
$$\leq f^\theta p^\theta = (fp)^\theta$$

A value of θ>1 is typically used such that the false positive probability is relatively small.

Probability of Classification Failure

A classification failure is deemed to have occurred if even one of the f−θ hash sets returns a one when checking for the group id of some x∈S.

$$Pr[\text{Classification Failure}] = 1 - (1-p)^{f-\theta} \leq (f-\theta)p \leq fp \quad \text{(eq. 7)}$$

Note that the classification failure probability is usually far greater than the false positive probability. If the values of the target false positive probability α and the classification failure β are similar in magnitude, then the classification failure probability will determine the memory size.

Capacity

The capacity of a (f,θ)-COMB is now computed. Since a constant weight code of θ out of a possible f bits is used to represent the group id, the group capacity of the COMB represented by ρ(f,θ) is given by $$\rho(f, \theta) = \binom{f}{\theta}. \quad \text{(eq. 8)}$$

The capacity of an (f,θ)-COMB with m bits of memory is the number of elements that it can accommodate while satisfying the error bounds. From the analysis of the error probabilities, the following relationships are determined: $(fp)^\theta < \alpha$ and $fp < \beta$. Substituting $p = (0.6185)^{m/n\theta}$ and solving for n results in a capacity κ(f,θ) of a (f,θ)-COMB as follows:

$$\kappa(f, \theta) = 0.48 \frac{m}{\theta \log \frac{1}{\lambda}}$$

where $$\lambda = \min\left\{\frac{\alpha^{\frac{1}{\theta}}}{f}, \frac{\beta}{f}\right\}. \quad \text{(eq. 9)}$$

If the value of θ>1, as is typically the case to keep the number of memory accesses for checking low, the second term in minimization is lower and hence the classification failure probability dominates. In addition note that the number of hashes h=1.44 log (θ/β), the number of memory accesses for insertion is θh and the number of memory accesses for checking is fh.

Parallelizing Memory Accesses

In a Bloom filter with h hashes, the total memory of m can be partitioned into chunks of m/h each. Each hash function has access to its own memory chunk. Therefore access can be parallelized and both insertion and deletion can be done in time proportional to one memory access. In various embodiments, the partitioning is performed in a manner adapted to maintain a similar load on each chunk of memory.

In a (f,θ) COMB there are f sets of hashes, each having h hash functions. Assume a partition of the total memory of m into h chunks of m/h each. Assume that the first hash function of each hash set has access to the first chunk. The second hash function in each hash set accesses the second hash function and so on.

During insertion, θ hash sets are used. Therefore, the embodiments hash θ times in parallel into each of the h memory chunks. The number of memory accesses per chunk is θ. Therefore the amount of memory accesses for insertion is θ and not θh when using a single chunk of memory. Similarly during checking, the embodiments hash f times in parallel into each chunk of memory and therefore the memory access overhead for checking is f. Parallelizing reduces insertion as well as checking memory overhead by a factor of f. When k-port memory is available, there will be another κ times reduction on the memory access overhead.

Partitioned COMB

One variant of a COMB that can tradeoff memory and lookup complexity is denoted as a Partitioned Combinatorial Bloom Filter (PCOMB). A PCOMB is characterized by f hash functions that are partitioned into p subsets. Let $f_j$ denotes the number of hash functions in partition j, which provides that $$\sum_j f_j = f.$$

Associated with partition j is a fixed length code with weight $\theta_j$. Therefore, a PCOMB is represented as $\{(f_1,\theta_1), (f_2,\theta_2), \ldots, (f_p,\theta_p)\}$. Assume that memory is partitioned into p blocks where block j of memory is allocated to partition j. Let $m_j$ be the amount of memory allocated to partition j. Set the following condition:

$$m_j = \frac{\theta_j}{\sum_{i=1}^{p} \theta_i} m. \quad \text{(eq. 10)}$$

Therefore, memory is allocated proportional to the code weight of the partition. Each memory partition is further partitioned into h equal chunks, one chunk for each hash function as in the COMB case. Therefore, all the $j^{th}$ hash functions partition i hash into one section of memory for j=1, 2, ..., h and i=1, 2, ..., p. The group capacity of a PCOMB is given by:

$$\rho = \prod_{i=1}^{p} \binom{f_i}{\theta_i}. \quad \text{(eq. 11)}$$

Since memory accesses are parallelized at two levels, memory access overhead for insertion is $\max_{1 \le i \le p} \theta_i$ and the overhead for testing is $\max_{1 \le i \le p} f_i$. Also note that the capacity $$\kappa = 0.48 \min_{1 \le i \le p} \frac{m_i}{\theta_i \log \frac{1}{\lambda}}. \quad \text{(eq. 12)}$$

Since the value of $m_i$ proportional to $\theta_i$, the capacity $$\kappa = 0.48 \frac{m}{\theta \log \frac{1}{\lambda}}. \quad \text{(eq. 13)}$$

Note however that partitioning typically leads to a larger value $$\sum_i \theta_i$$

that represents the load on the COMB. This increases the load on the memory leads to a decrease in insertion and checking overhead.

Numerical Example

A numerical example is now provided to illustrate some of the design choices that made while constructing a COMB. Consider a set S comprising of elements that can belong to one of 1024 groups. Assume an available 1 megabits of memory for the COMB and that both the false positive probability and classification failure probabilities are $10^{-6}$. The embodiments can use a (1024,1)-COMB, but checking for membership will require 1024 memory accesses which is impractical. The capacity of a (1024,1)-COMB is 23160. The embodiments can use a (46,2)-COMB and insertions will involve 2 memory accesses and checking will be 46 memory accesses. The capacity of a (46,2)-COMB is 13650 since each arrival hashes twice into the COMB. The embodiments can also use a (20,3)-COMB which involves only 20 memory accesses, although its capacity is only 9629. Another alternative is to use a partitioned $\{(9,2),(9,2)\}$-PCOMB since $$\binom{9}{2}\binom{9}{2} \ge 1024. \quad \text{(eq. 14)}$$

This will only have 9 memory accesses and its capacity is 7790. Thus there is a natural trade-off between memory access and capacity.

Error Corrected COMB Embodiments

As previously noted, a performance measure that determines the capacity of a COMB is classification failure. Classification failure occurs when determining the group id of some $x \in S$, and a false positive is returned from some hash set j where component j of C(g(x)) is zero.

In one embodiment, the performance of a COMB is improved by coding the group id using an error correcting code. Instead of C(g( )) being an arbitrary f bit binary code, an f bit error correction code is used. The error corrected COMB or ECOMB is implemented in hardware in various embodiments to provide rapid, high accuracy membership testing of candidate data elements without knowing the number of data elements in a set or group.

Depending on the number of errors corrected, one or more false positives can be tolerated. The trade-off is that using an error correcting code reduces the number of valid codewords and, hence, the number groups that can be handled by the COMB. The weight spectrum of an error correcting code gives the code weight distribution of an error correcting code.

Consider the (7,4) Hamming code. This code can correct one error. It has 4 data bits and 3 error correcting bits. It has $2^4-1=15$ non-zero code words. It has 7 code words with weight 3, 7 code words with weight 4, and 1 code word with weight 7. To maintain the property that there are no misclassifications, then only constant weight codes are used. If less than 7 possible group ids, then the embodiments may use code words of weight 3 in a (7,4) Hamming code to represent the 7 group ids. If there is one error, then the code corrects the error. If there is more than one error, then 5 ones will be seen when checking for the group id for some $x \in S$, and classification failure will be declared. The term $(f,\theta,t)$-ECOMB is used to denote an $(f\theta)$-COMB that corrects t errors.

Effect of Error Correction

The effect of error correction is to reduce the probability of classification failure. Consider the case of correcting one error. Let $p_m$ denote the false positive probability for any given hash set. The probability of a classification failure is the probability of greater than 1 false positive. This is given by:

$$Pr[> 1 \text{ false } pos.] = 1 - (1-p)^{f-\theta} - fp(1-p)^{f-\theta-1} \quad \text{(eq. 14)}$$
$$\leq 1 - (1-p)^f - fp(1-p)^{f-\theta}$$
$$\leq 1 - (1-p(f-\theta))(1+p(f-\theta)f)$$
$$= (p(f-\theta))^2 \leq (pf)^2.$$

This reduction in classification failure results in an improvement results in an improvement in capacity. Assume that a (f,θ)-COMB. If the classification failure is the bottleneck, then the capacity of the (f,θ,1)-ECOMB is $$\kappa(f, \theta, 1) = 0.48 \frac{m}{\theta \log \frac{1}{\lambda}} \quad \text{(eq. 15)}$$

where $$\lambda = \min\left\{\frac{\alpha^{\frac{1}{\theta}}}{f}, \frac{\beta^{\frac{1}{2}}}{f}\right\}.$$

Note the factor of $\beta^{1/2}$ instead of $\beta$ for a standard COMB. This leads to a doubling of the capacity compared to a COMB (with no error correction) with the same parameters. Whether error correction helps in a particular case depends on the existence of a light constant weight code with enough code words to code all the groups. This issue as well as the effect of correcting multiple errors will now be addressed.

Constant Weight $^t$ Error Correcting Codes

With respect to correcting multiple errors, in order to maintain the property of not having misclassification, the error correcting is a constant weight code. Let λ(f,θ,t) denote the maximum number of code words in fixed length binary code of length f, weight θ that can correct t errors. The value of π( ) is known for several combinations of f, θ and t. It is necessary to ensure that π(f,θ,t) is greater than the number of groups. If the code corrects for t errors then the classification failure probability is $$Pr[> t \text{ false positive}] = \sum_{j=t+1}^{f-\theta} \binom{f-\theta}{j} p^j (1-p)^{f-\theta-j} \quad \text{(eq. 16)}$$
$$\leq \sum_{j=t+1}^{f-\theta} \binom{f-\theta}{j} p^j$$
$$\leq \sum_{j=t+1}^{f-\theta} \frac{(f-\theta)^j p^j}{j!}$$
$$= \frac{(fp)^{t+1}}{(t+1)!} + o((fp)^{t+1})$$

Therefore the leading term is:

$$\frac{(fp)^{t+1}}{(t+1)!} \quad \text{(eq. 17)}$$

Note that for single error correction, there is an additional factor of 2 since the analysis is tighter. The capacity of an (f,θ,t)-ECOMB is:

$$\kappa(f, \theta, t) = 0.48 \frac{m}{\theta \log \frac{1}{\lambda}} \quad \text{(eq. 18)}$$

where $$\lambda = \min\left\{\frac{\alpha^{\frac{1}{\theta}}}{f}, \frac{[(t+1)!\beta]^{\frac{1}{t+1}}}{f}\right\}$$

The number of memory accesses for insertion is f and the number of memory accesses for checking is θ.

Numerical Examples

The inventors conducted tests with various examples to show the performance of COMB and ECOMB. Three group id sizes are considered; 128, 1024 and 8192. Each case uses a different COMB and ECOMB to accommodate the group id space.

For constant weight error correcting codes, codes of the appropriate size may be determined in accordance with the teachings of a paper by E. M. Rains and N. J. A. Sloane, entitled "Table of constant weight binary codes," which may be viewed at http://www.research.att.com/njas/codes/Andw/, which is incorporated herein by reference in its entirety.

For example, assuming that a memory is 1 megabits and both false positive probability as well as classification failure probabilities are $10^{-6}$. The capacity of a COMB or ECOMB may be plotted as a function of the number of memory accesses used for the checking (probing) function. Note that in general the capacity increases with checking memory access. The code is of the form (f,θ,t), where f is the number of hash sets, θ is the number of memory accesses for insertion and t is the number of errors corrected by the code.

A code is said to be dominated if there is another code whose capacity is greater and the amount of memory accesses is smaller. As the group size increases, error correction provides a significant increase in capacity. This is due to the fact that when the code weight is high for non-error correcting code, the overhead for error correction is low.

In summary, error correction offers additional flexibility and allows improved tradeoff between number of memory accesses and capacity. What parameter to select depends on requirement of the application. For example, for group capacity of 1024, to maximize the filter capacity, one can choose parameters such as (29, 3, 1); that is, using 29 hash sets, 3 memory accesses for insertion, and 1 error correction. If memory check speed is the main concern, one should choose parameters such as (11, 3, 0), or even use PCOMB to further reduce number of memory accesses.

ECOMB Implementation

In this section an example hardware implementation of ECOMB is discussed. In various embodiments, a hardware efficient method of generating independent hash functions is employed. This method produces n "independent" hash values using just O(log n) independent seed hash functions.

In this embodiment, each new hash value is acquired by XORing a subset of the hash values produced by seed hash functions. These synthetic hash values exhibit excellent random and independency. Experiments conducted by the inventors show that, when all the other configurations are identical, the Bloom filters implemented with this hashing scheme provide the same false positive rate as the Bloom filters using independent hash functions.

In one embodiment, the $H_3$ hash functions are used as seeds because they are simple and fast. Such functions are described in more detail by M. Ramakrishna, E. Fu, and E. Bahcekapili in a paper entitled "A performance study of hashing functions for hardware applications," in Proc. 6th Int'l Conf. Computing and Information, 1994, which is incorporated herein by reference in its entirety.

Since this technique of generating hash functions is relatively efficient, the hash value can be generated in just one clock cycle. As an example, when generating 256 16-bit hash values, this scheme needs only 13K registers, accounting for only 5% of the resource consumed by the scheme that implements 256 $H_3$ hash functions.

Error Correction and Decoding

Binary code error correction is one of several error correction schemes suitable for use within the context of the present embodiments. For example, a parallel error correction circuit using Linear Feedback Shift Registers (LFSRs) can correct errors in a block in just one clock cycle. In one embodiment, the constant weight code is used as the group id. In one embodiment where the constant weight code is mapped to an arbitrary ID, a content addressable memory (CAM) may be used to achieve the mapping.

Overall Architecture

Figure 6:
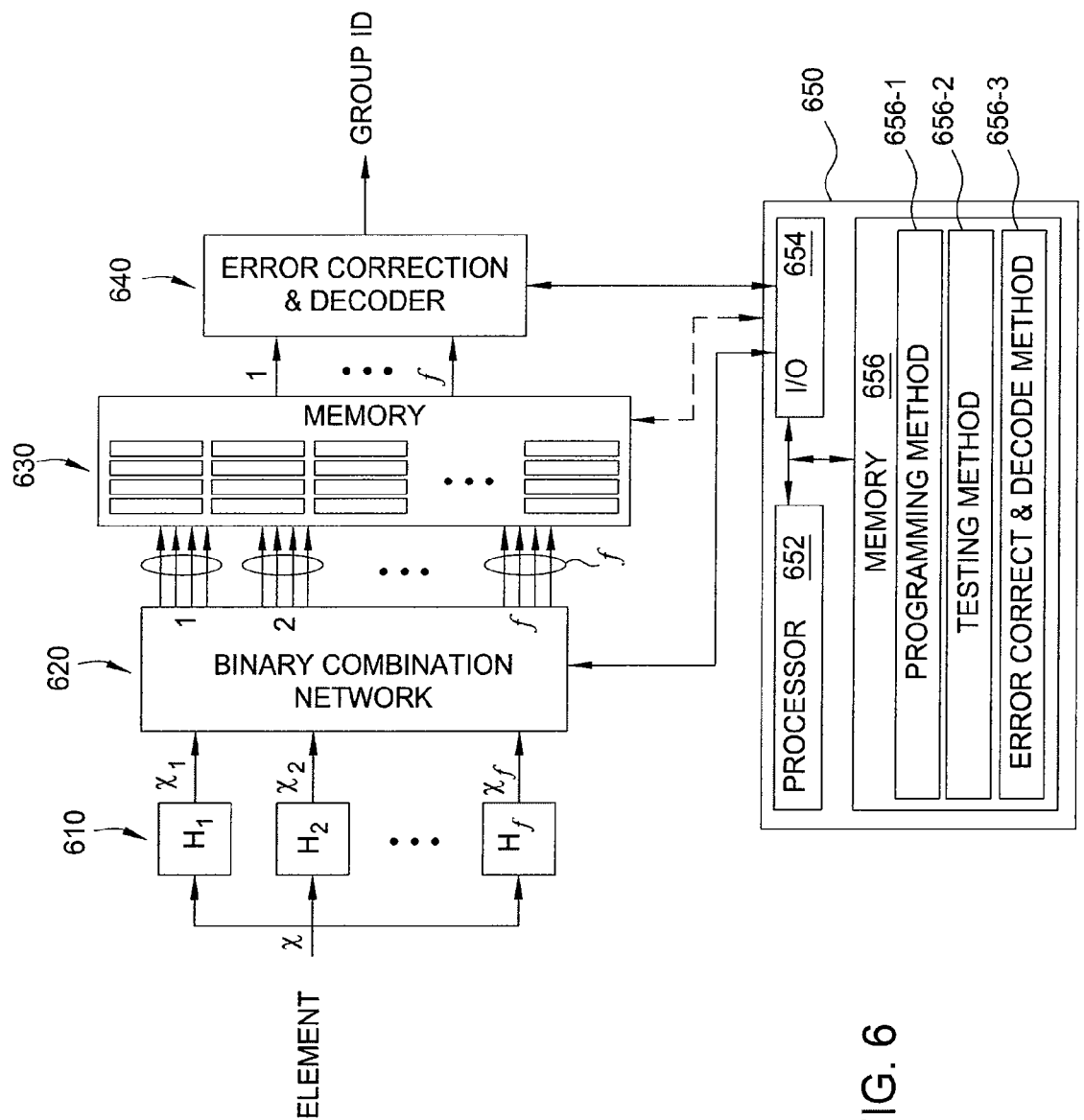
FIG. 6 depicts a high level block diagram of a hardware implementation according to one embodiment.

FIG. 6 depicts a high level block diagram of a hardware implementation of an error correction COMB. Specifically, the implementation 600 comprises a pipeline architecture which enables a throughput of, illustratively, f/ks clock cycles per element lookup, where f is the number of hash groups, k is the port number of memory block, and s is the memory speedup factor.

The hardware implementation 600 of FIG. 6 comprises a first circuit 610 implementing a plurality f of hash function groups H, denoted as groups $H_1$, $H_2$ and so on through $H_f$ (collectively hash function groups. H), a second circuit 620 implementing a binary combination network 620, a memory circuit 630, an error correction and decoder circuit 640, and a controller 650. The hardware implementation 600 may be provided via a field programmable gate array (FPGA), and application specific integrated circuit (ASIC), a special-purpose integrated circuit and the like. It should also be noted that the controller 650 may be included within the integrated circuit upon which the hardware implementation 600 is provided, or off the circuit such as part of a remote control element.

The first circuit 610 implements a plurality (illustratively f) hash function groups, each of which includes h hash functions. The first circuit 610 is capable of processing or hashing a received data element x according to each of the hash functions in each of the groups to produce a plurality of data signals $x_1$, $x_2$ and so on through $x_f$ indicative of the results of such hashing. The hashing indicative data signals provided by the hashing circuits are processed by the binary combination network 620.

The hardware implementation 600 operates in either a programming (insertion) mode or a test (classification) mode. In the programming mode of operation, each of a plurality of data elements x within a set of data elements S is hashed using each of the h hash functions within each of the f hash function groups 610. Only those data signals associated with desired or selected hash function groups are used to program the Bloom filter or array of Bloom filters within the memory 630. In the test mode of operation, each received data element x is hashed using each of the h hash functions within each of the f hash function groups 610. All data signals associated with the f hash function groups are used to probe the Bloom filter or array of Bloom filters within the memory 630.

The binary combination network 620 is responsive to the controller 652 operate in either of a programming mode or a test mode. In the programming mode of operation, the binary combination network 620 only passes data signals associated with the desired or selected hash function groups to the Bloom filter or array of Bloom filters within the memory 630. In the test mode of operation, the binary combination network 620 passes all data signals associated with the hash function groups to the Bloom filter or array of Bloom filters within the memory 630.

The memory 630 is used to implement one or more Bloom filters. The memory 630 is optionally configurable via a control signal provided by the controller 650. In operation, the Bloom filter produces an f-bit output vector. The f-bit output vector is decoded by error correction and decoder circuit 640. The parallelizing memory access architecture and techniques discussed above are, optionally, employed within the context of the memory 630.

The error correction and decoder circuit 640 processes the f-bit output vector to provide thereby group identification, set membership information and the like. As previously noted, the output vector bits are encoded to be indicative of group identification, set membership and the like associated with processed data elements x. Error correction schemes are optionally implemented using Hamming codes, forward error correction (FEC), checksums, parity bits and/or other techniques. The decoding algorithm and/or error correction algorithm may be hardcoded into the error correction decoder circuit 640 or programmed into the circuit 640 via the controller 650.

The controller 650 comprises at least one microprocessor 652, input output circuitry 654, a memory 656, various support circuits such as power supplies, clocks and the like (not shown). Generally speaking, the controller 650 may comprise a specific processing element located on a common substrate or programmable device along with the other elements within the hardware implementation 600. In one embodiment, the controller 650 is not co-located with the other elements within the hard recommendation 600. Specifically, the controller 650 may comprise a computer such as a personal computer, networked workstation, network server and the like.

The memory 656 may comprise various types of computer readable medium including, but not limited to, random access memory, read only memory, removable disk memory, flash memory and various combinations of these types of memory. The memory 656 may comprise a cache memory or a buffer memory associated with the processor 652.

The memory 656 stores various software packages or programs to perform operations according to the various embodiments discussed herein. For example, the memory 656 is depicted as including software for performing a programming method 656-1, a testing method 656-2 and an error correction and decode method 656-3. Embodiments of these methods have previously been discussed with respect to the various figures. When the programming method is executed, the controller 650 causes the binary combination network 620 to enter the programming mode of operation. When the testing method 656-2 is executed, the controller 650 causes the binary combination network 620 to enter the test mode of operation. When the error correction and decode method 656-3 is executed, the controller 650 causes the error correction and decoder circuit 640 to utilize the appropriate decoding and (optionally) error correction techniques.

When running a particular software package or program, such as packages or programs implementing the methodologies and techniques of the present embodiments, the controller 650 becomes a special purpose machine for implementing these various embodiments, methodologies and techniques described herein with respect to the various Figures and as described above.

The controller 650 may contain one or more interfaces selected from the group consisting of a keyboard, mouse, touch screen, keypad, voice activated interface for entering data and/or executing management command functions in the network including but not limited to the configuration of the sniffer as a partition designated node as described above.

Various embodiments are implemented as a program product for use with a computer system. The program(s) of the program product defines functions of the embodiments (including the methods described herein) and can be contained on a variety of computer readable storage media. Illustrative computer readable storage media include, but are not limited to: (i) non-writable storage media (e.g., read-only memory devices within a computer such as CD-ROM disks readable by a CD-ROM drive and DVDs readable by a DVD player) on which information is permanently stored; and (ii) writable storage media (e.g., floppy disks within a diskette drive, a hard disk drive or random access memory) on which alterable information is stored. Such computer readable storage media, when carrying computer readable instructions that direct the functions of the present invention, are embodiments of the present invention. Other media include communications media through which information is conveyed to a computer, such as through a computer or telephone network, including wireless communications networks. The latter embodiment specifically includes transmitting information to/from the Internet and other networks. Such communications media, when carrying computer readable instructions that direct the functions of the present invention, are embodiments of the present invention. Broadly, computer readable storage media and communications media may be referred to herein as computer readable media.

Although various embodiments which incorporate the teachings of the present invention have been shown and described in detail herein, those skilled in the art can readily devise many other varied embodiments that still incorporate these teachings.

What is claimed is:

1. A method for identifying group membership of a candidate data element in a data processing apparatus including at least a memory circuit, the method comprising:
   providing in the memory circuit a plurality of hash sets operative to program a single Bloom filter with a plurality of non-zero f-bit binary vectors, each of the f-bit binary vectors being associated with a respective group indicative of group IDs for one or more candidate data elements;
   performing group membership probes into the Bloom filter using candidate data elements to generate thereby f-bit binary vector output signal indicative of a matching function.

2. The method of claim 1, wherein group membership probes into the Bloom filter are performed by hashing candidate data elements according to each of h hashing functions of each of f sets of hashing functions.

3. The method of claim 2, wherein the Bloom filter is programmed by hashing each data element of a group with each of the h hashing functions of a subset θ of the f sets of hashing functions.

4. The method of claim 3, wherein a group membership probe resulting in an f-bit binary vector output signal having fewer than θ bits indicates a no match condition.

5. The method of claim 3, wherein a group membership probe resulting in an f-bit binary vector output signal having more than θ bits indicates a misclassification error.

6. The method of claim 1, wherein the candidate data element comprises a media access control (MAC) address associated with a data frame, and the group comprises an output port of a switching device associated with the MAC address.

7. The method of claim 6, wherein the switching device comprises a Layer-2 switch.

8. The method of claim 1, wherein the candidate data element comprises a data packet and the group comprises a classification associated with the packet.

9. The method of claim 1, wherein the group comprises a pattern associated with the data element.

10. The method of claim 9, wherein the data element comprises one of a data packet and a data frame.

11. The method of claim 1, further comprising:
    error correcting the f-bit binary vector output signal using any of Hamming codes, forward error correction (FEC), checksums and parity bits.

12. An apparatus for identifying group membership of a candidate data element, comprising:
    a first memory, for storing a plurality of hash sets operative to program a single Bloom filter with a plurality of non-zero f-bit binary vectors, each of the f-bit binary vectors being associated with a respective group indicative of group IDs for one or more candidate data elements; and
    a second memory, for storing f sets of h hashing functions;
    wherein group membership probes into the Bloom filter are performed by hashing candidate data elements according to each of the h hashing functions of each of the f sets of hashing functions.

13. The apparatus of claim 12, wherein the Bloom filter is programmed by hashing each data element of a group with each of the h hashing functions of a subset of the f sets of hashing functions.

14. The apparatus of claim 12, wherein said apparatus further comprises a decoder circuit adapted to decode f-bit binary vectors provided by the first memory to determine thereby a group associated with a candidate data element.

15. The apparatus of claim 12, wherein the Bloom filter is programmed by hashing each data element of a group with each of the h hashing functions of a subset θ of the f sets of hashing functions.

16. The apparatus of claim 15, wherein a group membership probe resulting in a binary vector having fewer than θ bits indicates a no match condition, and a binary vector having more than θ bits indicates a misclassification error.

17. The apparatus of claim 14, wherein the first memory, second memory and decoder circuit are implemented in a programmable logic device.

18. The apparatus of claim 17, further comprising a controller, for selectively placing the apparatus in one of a programming operational state and a testing operational state.

19. A computer-readable non-transitory medium storing a software program, that, when executed by a computer, causes the computer to perform a method for identifying group membership of a candidate data element, the method comprising:
    providing in the memory circuit a plurality of hash sets operative to program a single Bloom filter with a plurality of non-zero f-bit binary vectors, each of the f-bit binary vectors being associated with a respective group indicative of group IDs for one or more candidate data elements;
    performing group membership probes into the Bloom filter using candidate data elements.

20. The computer-readable medium of claim 19, wherein group membership probes into the Bloom filter are performed by hashing candidate data elements according to each of h hashing functions of each of f sets of hashing functions.

21. The computer-readable medium of claim 20, wherein the Bloom filter is programmed by hashing each data element of a group with each of the h hashing functions of a subset of the f sets of hashing functions.

* * * * *